*(12)* United States Patent
Katz et al.

(10) Patent No.: US 11,557,691 B2
(45) Date of Patent: Jan. 17, 2023

(54) METHOD OF MANUFACTURING A SEMICONDUCTOR DEVICE AND SEMICONDUCTOR DEVICE

(71) Applicant: OSRAM OLED GmbH, Regensburg (DE)

(72) Inventors: Simeon Katz, Regensburg (DE); Sophia Huppmann, Geldersheim (DE)

(73) Assignee: OSRAM OLED GmbH, Regensburg (DE)

( * ) Notice: Subject to any disclaimer, the term of this patent is extended or adjusted under 35 U.S.C. 154(b) by 72 days.

(21) Appl. No.: 16/958,055

(22) PCT Filed: Feb. 6, 2019

(86) PCT No.: PCT/EP2019/052890
§ 371 (c)(1),
(2) Date: Jun. 25, 2020

(87) PCT Pub. No.: WO2019/158416
PCT Pub. Date: Aug. 22, 2019

(65) Prior Publication Data
US 2021/0066539 A1   Mar. 4, 2021

(30) Foreign Application Priority Data
Feb. 13, 2018   (DE) .................. 102018103169.6

(51) Int. Cl.
*H01L 33/00*   (2010.01)
*H01L 33/62*   (2010.01)
*H01S 5/0236*   (2021.01)

(52) U.S. Cl.
CPC .......... *H01L 33/0093* (2020.05); *H01L 33/62* (2013.01); *H01S 5/0236* (2021.01); *H01L 2933/0066* (2013.01)

(58) Field of Classification Search
None
See application file for complete search history.

(56) References Cited

U.S. PATENT DOCUMENTS 8,450,751 B2   5/2013   Engl et al.
2007/0232023 A1*  10/2007   Tong .................. H01L 24/08
                                         438/455

(Continued)

FOREIGN PATENT DOCUMENTS

DE   102007022947 A1   10/2008
DE   102008038852 A1   12/2009

(Continued)

*Primary Examiner* — Robert K Carpenter
(74) *Attorney, Agent, or Firm* — Slater Matsil, LLP (57) ABSTRACT

In an embodiment a method includes forming a semiconductor layer sequence on a growth substrate, applying a silicon oxide layer to a surface of the semiconductor layer sequence facing away from the growth substrate, applying a first metal layer to the silicon oxide layer, wherein the first metal layer includes gold, platinum, copper or silver, providing a silicon substrate and applying a second metal layer formed of the same material as the first metal layer to the silicon substrate, bonding the semiconductor layer sequence to the silicon substrate by direct bonding of the first metal layer to the second metal layer, wherein the first metal layer and the second metal layer are brought into contact at a temperature in a range of 150° C. to 400° C. so that they form a metal bonding layer and detaching the growth substrate from the semiconductor layer sequence.

16 Claims, 4 Drawing Sheets

(56) References Cited

U.S. PATENT DOCUMENTS

2009/0189224 A1* 7/2009 Matsumoto ..... H01L 21/823842
  257/369
2014/0014990 A1   1/2014 Kim et al.
2014/0273318 A1   9/2014 Ryu et al.
2018/0331153 A1* 11/2018 Robin ................... H01L 25/167

FOREIGN PATENT DOCUMENTS

| JP | 2005277372 A | * | 10/2005 | ............ H01L 33/30 |
| JP | 4062111 B2 | * | 3/2008 | ......... H01L 33/0079 |
| JP | 2017050392 A | * | 3/2017 | |
| WO | 2012164431 A1 | | 12/2012 | |

* cited by examiner

METHOD OF MANUFACTURING A SEMICONDUCTOR DEVICE AND SEMICONDUCTOR DEVICE

This patent application is a national phase filing under section 371 of PCT/EP2019/052890, filed Feb. 6, 2019, which claims the priority of German patent application 102018103169.6, filed Feb. 13, 2018, each of which is incorporated herein by reference in its entirety.

TECHNICAL FIELD

The application relates to a method for manufacturing a semiconductor device, in particular a semiconductor device based on a nitride compound semiconductor, which is bonded to a silicon substrate. Furthermore, the application relates to a semiconductor device which can be manufactured by means of the method.

BACKGROUND

Semiconductor devices based on a nitride compound semiconductor are usually manufactured by epitaxial growth of a semiconductor layer sequence onto a suitable growth substrate, such as sapphire. Since growth substrates suitable for growing nitride compound semiconductors are usually comparatively expensive, it can be expedient to transfer the semiconductor body to a comparatively inexpensive carrier substrate, such as a silicon substrate, and to remove the growth substrate. A connection between the semiconductor body and the new carrier substrate can be made by a connection layer, such as a solder layer, or by direct bonding.

Direct bonding is a technique for wafer bonding that does not use adhesion-promoting intermediate layers. Direct bonding is possible, for example, if the two surfaces to be joined each have silicon oxide ($SiO_2$). The silicon oxide layers can, for example, be applied to the semiconductor body and the carrier substrate before direct bonding.

It has turned out that when a semiconductor body based on a nitride compound semiconductor material is bonded to a silicon substrate by direct bonding, in particular by means of silicon oxide layers, a comparatively large stress occurs due to the different thermal expansion coefficients of gallium nitride and silicon. This can cause the silicon substrate to exhibit a bow after bonding to the semiconductor body and detaching the growth substrate.

SUMMARY

Embodiments provide an improved method for manufacturing a semiconductor device in which a semiconductor layer sequence is bonded to a silicon substrate. Further embodiments provide a semiconductor device which can be manufactured with the method that is characterized by good adhesion of the semiconductor layer sequence to the silicon substrate and only slight bow of the silicon substrate.

According to at least one embodiment of the method, a semiconductor layer sequence is first produced on a growth substrate. The semiconductor layer sequence can be grown epitaxially on the growth substrate. The semiconductor layer sequence can in particular be the semiconductor layer sequence of an electronic or optoelectronic device. In the case of an optoelectronic device, the semiconductor layer sequence may in particular be the functional layer sequence of a light-emitting diode or a laser diode. The semiconductor layer sequence may in particular be based on a nitride compound semiconductor. The growth substrate of the semiconductor body may in particular be a sapphire substrate.

According to at least one configuration of the method, a silicon oxide layer is applied to the surface of the semiconductor layer sequence facing away from the growth substrate. The silicon oxide layer is in particular a $SiO_2$ layer. The silicon oxide layer can be deposited by a CVD process, for example. The thickness of the silicon oxide layer, for example, is between 300 nm and 3 µm.

The fact that a layer or an element is arranged or applied "on" or "over" another layer or another element can mean here and in the following that one layer or one element is arranged directly in direct mechanical and/or electrical contact on the other layer or the other element. Furthermore, it may also mean that one layer or element is placed or applied indirectly on or over the other layer or element. Further layers and/or elements can then be arranged between the one and the other layer or between the one and the other element.

According to at least one configuration of the method, a first metal layer is applied to the silicon oxide layer in a further step. This can be done by sputtering, for example. The first metal layer contains or consists of one of the metals Au, Pt, Ag or Cu.

According to at least one embodiment of the method, a silicon substrate is provided and a second metal layer is deposited on the silicon substrate. This can be done by sputtering, for example. The second metal layer is formed from the same metal as the first metal layer. In particular, the second metal layer comprises or consists of one of the metals Au, Pt, Ag or Cu.

According to at least one configuration of the method, the semiconductor layer sequence is connected to the silicon substrate in a further step by direct bonding of the first metal layer to the second metal layer. In this step, the first metal layer and the second metal layer are brought into contact at a temperature in the range between 150° C. and 400° C. so that they form a metal bonding layer. After this step, the semiconductor layer sequence has been connected to the silicon substrate at a surface opposite the growth substrate, which can now act as a carrier substrate.

According to at least one configuration of the method, a further step is the detachment of the growth substrate from the semiconductor layer sequence. This can be done, for example, by a laser lift-off process.

According to a configuration, the method can comprise the following steps, in particular in the order mentioned:

forming a semiconductor layer sequence on a growth substrate, applying a silicon oxide layer on the surface of the semiconductor layer sequence facing away from the growth substrate, applying a first metal layer to the silicon oxide layer, wherein the first metal layer comprises gold, platinum, copper or silver, providing a silicon substrate and depositing a second metal layer formed of the same material as the first metal layer on the silicon substrate, bonding the semiconductor layer sequence to the silicon substrate by direct bonding of the first metal layer to the second metal layer, wherein the first metal layer and the second metal layer are brought into contact at a temperature in the range between 150° C. and 400° C. so that they form a metal bonding layer, and detaching the growth substrate from the semiconductor layer sequence.

The method has in particular the advantage that a particularly strong bond is achieved by direct bonding of the first metal layer and the second metal layer. In particular, direct bonding of the metal layers, preferably gold layers, achieves better adhesion than direct bonding of two $SiO_2$ layers. Furthermore, direct bonding of the metal layers does not require plasma activation. Furthermore, compared to the direct bonding of two $SiO_2$ layers, the method has the advantage that the direct bonding of the first and second metal layers can be carried out at a higher temperature, especially in the temperature range between 150° C. and 400° C.

Direct bonding of silicon oxide layers requires OH groups on the surface, which are no longer present at elevated temperatures above 100° C. The principle proposed here, according to which direct bonding with metal layers is carried out, makes particular use of the knowledge that in this case bonding can be carried out at a higher temperature, especially at at least 150° C. This advantageously reduces thermally induced stress between the semiconductor body, which can be based in particular on a nitride compound semiconductor material, and the silicon substrate.

In accordance with a preferred embodiment, direct bonding of the first metal layer to the second metal layer is carried out in the temperature range between 200° C. and 400° C., particularly preferably between 300° C. and 400° C. It has been found that the stress in the semiconductor layer sequence after the removal of the growth substrate is particularly low when direct bonding is carried out in this temperature range.

According to a preferred embodiment, the first metal layer and the second metal layer are gold layers.

Gold is particularly suitable for direct bonding according to the principle suggested herein because gold forms particularly smooth layers and is particularly resistant to oxidation.

According to at least one embodiment, an adhesion layer is applied before the first metal layer and/or the second metal layer is applied. In particular, an adhesion layer can be applied to the silicon oxide layer before the first metal layer is applied. Furthermore, an adhesion layer can be applied to the silicon substrate before the second metal layer is applied.

According to at least one embodiment, the adhesion layer is a titanium layer. A titanium layer is particularly well suited as an adhesion layer for a gold layer. The adhesion layer is especially a very thin layer. The thickness of the adhesion layer is preferably between 0.5 nm and 5 nm, for example about 1 nm.

According to at least one embodiment, the semiconductor layer sequence comprises a first contact layer and a second contact layer on a surface facing away from the growth substrate. The first contact layer and the second contact layer are arranged in particular laterally offset from each other. The first contact layer can, for example, be connected to a p-type semiconductor region of the semiconductor layer sequence and the second contact layer to an n-type semiconductor region of the semiconductor layer sequence.

According to at least one configuration, in a further step of the method, through holes are produced which extend through the silicon substrate, through the metal bonding layer and through the silicon oxide layer to the first contact layer and the second contact layer. The through holes are provided in particular as through contacts through the silicon substrate (TSV, Through Silicon Vias) to electrically connect the first contact layer and the second contact layer respectively through the carrier substrate. The through holes can be produced in particular by deep reactive ion etching (DRIE).

According to at least one configuration, a passivation layer is applied to walls of the through holes in a further step of the method. The passivation layer can be especially a $SiO_2$ layer. The passivation layer covers in particular the metal bonding layer exposed in the through holes. In this way a short circuit is avoided if the through holes for contacting the first contact layer and the second contact layer are filled with an electrically conductive material.

According to at least one configuration, the first metal layer and the second metal layer are each no more than 20 nm thick. In particular, the first metal layer and the second metal layer can be between 4 nm and 20 nm thick. A comparatively small thickness of the metal layer facilitates in particular the cutting through of the metal layers when creating the through holes for establishing an electrically conductive connection to the contact layers of the semiconductor layer sequence.

According to at least one embodiment, the silicon oxide layer is smoothed by chemical-mechanical polishing before the first metal layer is applied. In this way it is advantageously achieved that the comparatively thin metal layer forms a very smooth surface which is advantageous for direct bonding.

According to at least one configuration of the method, the semiconductor layer sequence is based on a nitride compound semiconductor. "Based on a nitride compound semiconductor" means in the present context that the semiconductor layer sequence or at least one layer thereof comprises a III-nitride compound semiconductor material, preferably $In_xAl_yGa_{1-x-y}N$, where $0 \le x \le 1$, $0 \le y \le 1$ and $x+y \le 1$. Here, this material need not necessarily have a mathematically exact composition according to the above formula. Rather, it may have one or more dopants and additional components. For simplicity's sake, however, the above formula only includes the essential components of the crystal lattice (In, Al, Ga, N), even if these may be partially replaced by small amounts of other substances.

In the case of a semiconductor layer sequence based on a nitride compound semiconductor, the growth substrate is preferably a sapphire substrate, which is advantageously suited for the epitaxial growth of nitride compound semiconductors. Since sapphire substrates are comparatively expensive, it is advantageous that the growth substrate is detached from the semiconductor body during the method so that it can be reused. The method is particularly advantageous for semiconductor bodies with a semiconductor layer sequence made of a nitride compound semiconductor, since the step of direct bonding of the metal layers can be carried out at a temperature of more than 200° C., especially in the temperature range from about 200° C. to about 400° C. and preferably in the temperature range from about 300° C. to about 400° C., since at such a high temperature the stress between the nitride compound semiconductor material and the silicon substrate is comparatively low. Such a high temperature would not be possible for direct bonding of $SiO_2$ layers, since the bonding energy for this material combination decreases significantly already above a temperature of about 100° C.

According to at least one embodiment of the method, the semiconductor device is an optoelectronic semiconductor device. In particular, the semiconductor device can be a radiation-emitting optoelectronic semiconductor device, for example a light-emitting diode or a laser diode.

A semiconductor device which can be produced by the method is also specified. According to at least one configuration, the semiconductor device comprises a semiconductor layer sequence which is arranged on a silicon substrate. The semiconductor layer sequence comprises a first contact layer and a second contact layer on a surface facing the silicon substrate. Furthermore, the semiconductor layer sequence comprises a silicon oxide layer on the surface facing the silicon substrate. The semiconductor device further comprises a metal bonding layer between the silicon substrate and the silicon oxide layer, the metal bonding layer comprising gold, silver, platinum or copper. The metal bonding layer advantageously enables a particularly good adhesion between the semiconductor layer sequence and the silicon substrate.

The metal bonding layer is preferably a gold layer or comprises a gold layer. It is possible that between the silicon oxide layer and the metal bonding layer and/or between the silicon substrate and the metal bonding layer an adhesion layer such as a titanium layer is arranged.

The semiconductor device may in particular be a so-called thin-film semiconductor device in which the growth substrate used for growing the semiconductor layer sequence is detached from the semiconductor layer sequence. In this case, the silicon substrate, which is connected to the semiconductor body by the metal bonding layer, functions as the carrier substrate of the semiconductor device.

In a configuration of the semiconductor device, the silicon substrate has through holes formed therein which extend through the silicon substrate, through the metal bonding layer and through the silicon oxide layer to the first contact layer and second contact layer. In this case, walls of the through holes are advantageously provided with a passivation layer. The passivation layer is an electrically insulating layer, such as a silicon oxide layer, which prevents an electrically conductive material in the through holes from coming into electrical contact with the metal bonding layer.

According to at least one configuration of the semiconductor device, the through holes are filled with an electrically conductive material which connects the first contact layer and the second contact layer each with a terminal contact on a carrier body. The electrically conductive material can be in particular copper. The carrier body can, for example, be a printed circuit board on which the semiconductor device is arranged. It is also possible that the carrier body is a semiconductor chip, which for example includes a driver circuit for the semiconductor device.

In particular, the semiconductor device can be a radiation-emitting optoelectronic semiconductor device, where a radiation exit surface is a surface of the semiconductor body facing away from the silicon substrate. In particular, the first contact layer and the second contact layer of the semiconductor layer sequence face the silicon substrate acting as the carrier substrate. The semiconductor device thus has a so-called flip-chip configuration.

The semiconductor device can be a light emitting diode or a semiconductor laser in particular, depending on its design.

Further advantageous configurations of the semiconductor device result from the description of the method and vice versa.

BRIEF DESCRIPTION OF THE DRAWINGS

The invention is explained in more detail below on the basis of exemplary embodiments in connection with FIGS. 1 to 12.

In the Figures.

DETAILED DESCRIPTION OF ILLUSTRATIVE EMBODIMENTS

Similar or similarly acting components are each provided with the same reference signs in the figures. The depicted components and the proportions of the components to each other are not to be regarded as true to scale. Rather, individual components may be shown in exaggerated size for clarification.

Figure 1:
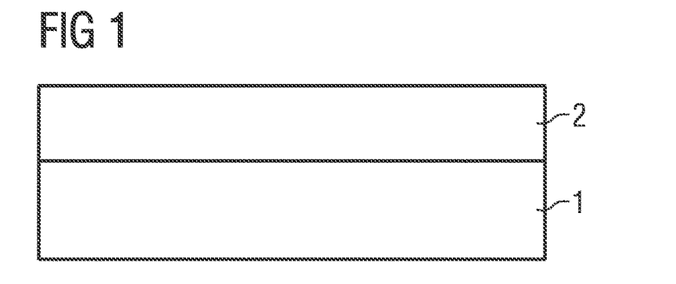
FIGS. 1 to 11 show a schematic representation of intermediate steps of the method in an exemplary embodiment.

In the intermediate step of the method shown in FIG. 1, a semiconductor layer sequence 2 has been applied to a growth substrate 1. The semiconductor layer sequence 2 can, in particular, be the functional layer sequence of an electronic or optoelectronic device. The semiconductor layer sequence 2 can have a large number of individual layers which are not shown individually here for simplification.

In the case of an optoelectronic device, the semiconductor layer sequence 2 can, for example, have a p-type semiconductor region, an n-type semiconductor region and an active layer arranged between the p-type semiconductor region and the n-type semiconductor region. In this case, semiconductor layer sequence 2 can in particular be a light emitting diode layer sequence.

The semiconductor layer sequence 2 may in particular be based on a nitride compound semiconductor. In this case, the growth substrate 1 may be in particular a sapphire substrate.

Figure 2:
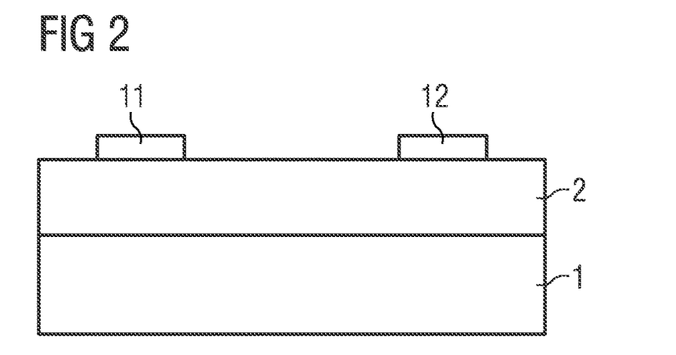

In the intermediate step of the method shown in FIG. 2, a first contact layer 11 and a second contact layer 12 have been deposited on the surface of the semiconductor layer sequence 2 facing away from the growth substrate 1. The first contact layer 11 and the second contact layer 12 may, for example, comprise one or more metal layers. The first contact layer 11 and the second contact layer 12 serve in particular for the electrical contacting of the semiconductor layer sequence 2 and are connected, for example, to regions of different polarity of the semiconductor layer sequence 2. For example, the first contact layer 11 is connected to a p-type semiconductor region of semiconductor layer sequence 2 and the second contact layer 12 is connected to an n-type semiconductor region of semiconductor layer sequence 2.

In order to enable the contacting of the different semiconductor regions, the semiconductor layer sequence 2 can have a suitable lateral structure, which is not shown here for simplification. For example, if the semiconductor layer sequence 2 comprises an n-type semiconductor region, an active layer and a p-type semiconductor region which are deposited on top of each other in this order, part of the p-type semiconductor region and the active layer can be removed to enable the second contact layer 12 to be applied on the n-type semiconductor region. Suitable structuring processes for this purpose, such as etching processes, are known to a person skilled in the art and are therefore not explained in detail here.

Figure 3:
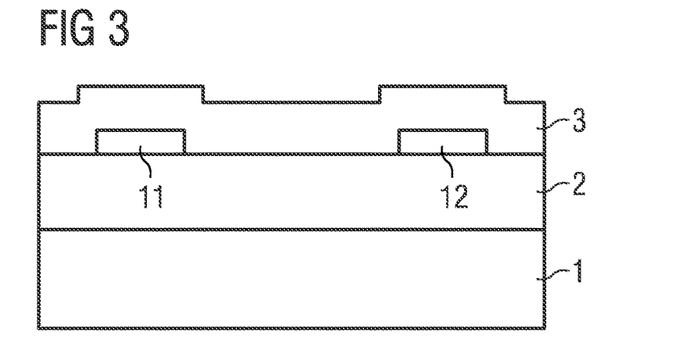

In the intermediate step shown in FIG. 3, a silicon oxide layer 3, in particular an SiO$_2$ layer, has been deposited on a surface of the semiconductor layer sequence 2 facing away from the growth substrate 1. The silicon oxide layer is preferably deposited by means of a CVD process. It is possible that the silicon oxide layer 3 covers the first contact layer 11 and the second contact layer 12 after this intermediate step. It is therefore possible that the surface of the silicon oxide layer 3 is not completely planar after deposition.

Figure 4:
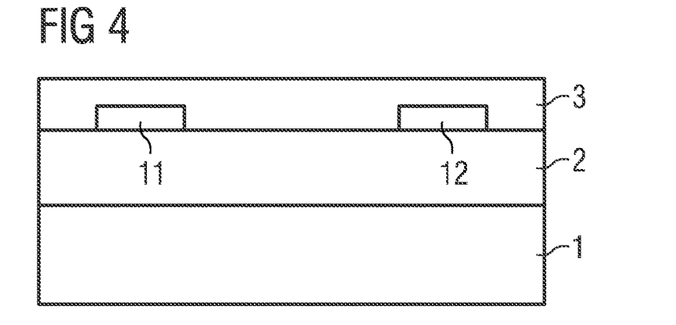

In the intermediate step shown in FIG. 4, the surface of the silicon oxide layer 3 has been planarized. The silicon oxide layer 3 can be planarized in particular by chemical mechanical polishing (CMP).

Figure 5:
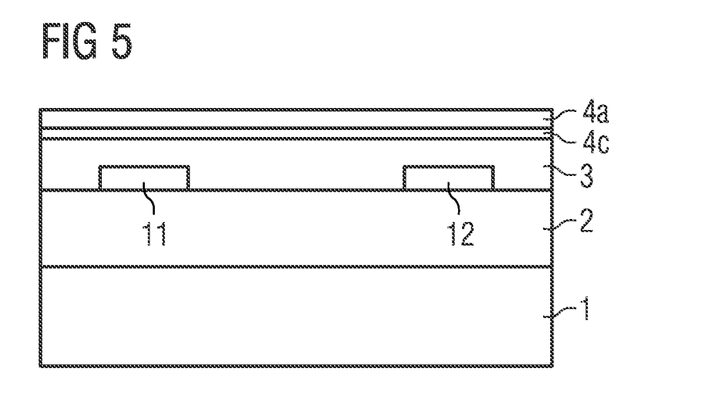

In the intermediate step of the method shown in FIG. 5, a first metal layer 4a has been applied to the silicon oxide layer 3. Preferably, the first metal layer 4a is a gold layer. The first metal layer 4a can be between 4 nm and 20 nm thick, for example. If a preferred configuration, an adhesion layer 4c is applied to the silicon oxide layer 3 before the first metal layer 4a is deposited. The adhesion layer 4c can be a titanium layer in particular. The adhesion layer 4c is preferably a thin layer whose thickness is only about 0.5 nm to 5 nm. The first metal layer 4a and/or the adhesion layer 4c can be applied in particular by sputtering.

Figure 6:
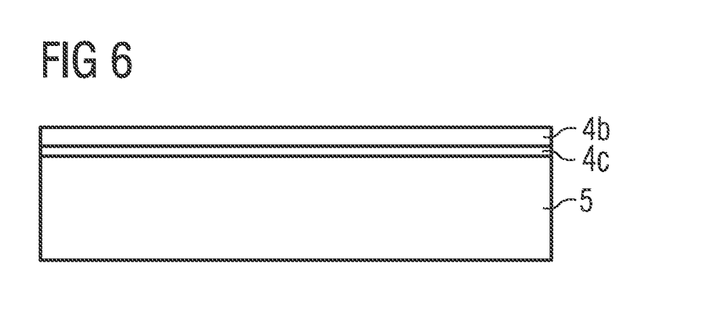

In the intermediate step shown in FIG. 6, a silicon substrate 5 has been provided which is supposed to serve as a carrier substrate for the semiconductor layer sequence in the finished semiconductor device. The silicon substrate 5 is preferably cleaned by $NH_3$ and/or ultrasound. A second metal layer 4b is applied to the silicon substrate 5, which consists of the same metal as the first metal layer 4a. Preferably, the first metal layer 4a and the second metal layer 4b are each gold layers. The second metal layer 4b can, for example, have a thickness between 4 nm and 20 nm like the first metal layer 4a. Before applying the second metal layer 4b, an adhesion layer 4c can be applied to the silicon substrate 5, as in the case of the first metal layer 4a. The adhesion layer 4c can in particular be a titanium layer which preferably has a thickness of 0.5 nm to 5 nm. The second metal layer 4b and/or the adhesion layer 4c is applied, in particular by sputtering.

Figure 7:
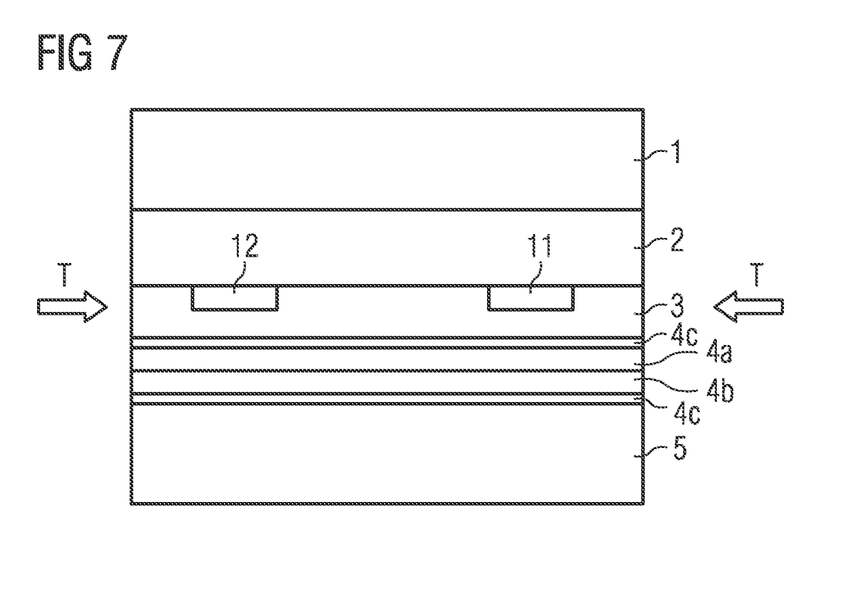

In the further intermediate step shown in FIG. 7, the first metal layer 4a and the second metal layer 4b are brought into direct contact with each other and thus joined together by direct bonding. Before the first metal layer 4a and the second metal layer 4b are brought in direct contact, the temperature T is increased to at least 150° C., preferably to a temperature T in the range of 200° C. to 400° C. In particular, the direct bonding is not carried out at room temperature. In direct bonding, the first metal layer 4a and the second metal layer 4b bond to each other at their interface and thus form a metal bonding layer 4. Direct bonding at a temperature between 150° C. and 400° C., preferably between 200° C. and 400° C., has the advantage that the stress between the silicon substrate 5 and the material of the semiconductor layer sequence 2, in particular a nitride compound semiconductor material, is advantageously low after removal of the growth substrate 1.

Figure 8:
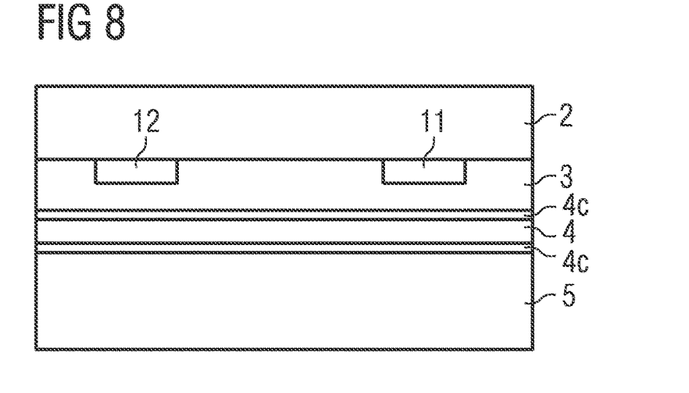

As shown in FIG. 8, the semiconductor layer sequence 2 is now connected to the silicon substrate 5 by the metal bonding layer 4. The silicon substrate 5 now functions as a carrier substrate for the semiconductor layer sequence 2. In the intermediate step of FIG. 8, the growth substrate 1 has been detached from the semiconductor layer sequence 2. The detachment of the growth substrate can be done by a laser lift-off process, for example.

Figure 9:
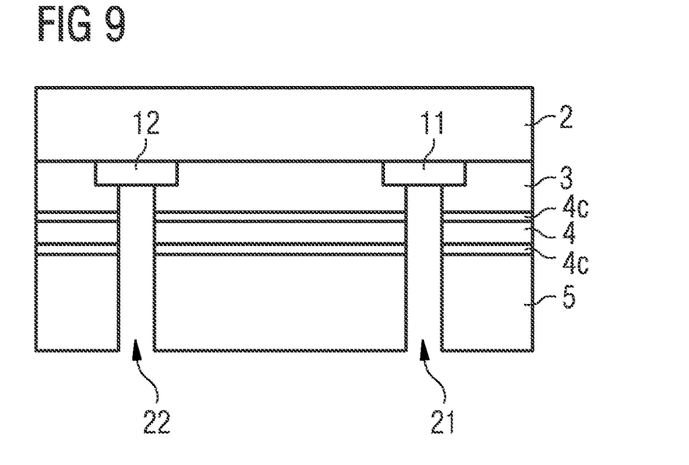

In the intermediate step shown in FIG. 9, through holes 21, 22 have been created in the silicon substrate 5, which also extend through the metal bonding layer 4 and the silicon oxide layer 3 to the first contact layer 11 and the second contact layer 12. The formation of the through holes 21, 22 in the silicon substrate 5 as well as the metal bonding layer 4 and if appropriate the bonding layers 4c can be carried out by reactive ion deep etching (DRIE), for example. For the production of the through holes in the silicon substrate 5 by means of DRIE, it is advantageous that the metal bonding layer 4 is located between the silicon oxide layer 3 and the silicon substrate 5. The electrical conductivity of the metal bonding layer 4 allows ions to flow off when the etching depth reaches the thickness of the silicon substrate 5. This prevents the etching process from continuing in a lateral direction (notching effect) when an electrically insulating material is reached. This would be the case if the silicon substrate was directly adjacent to the silicon oxide layer.

The silicon oxide layer 3 is also cut through when the through holes 21, 22 are made. An additional process step may be required to cut through the silicon oxide layer 3. The through holes 21, 22 can be produced in the area of the silicon oxide layer 3, for example, by a plasma etching process, especially with a fluorine-based etchant such as $SF_6$ or $ClF_3$.

Figure 10:
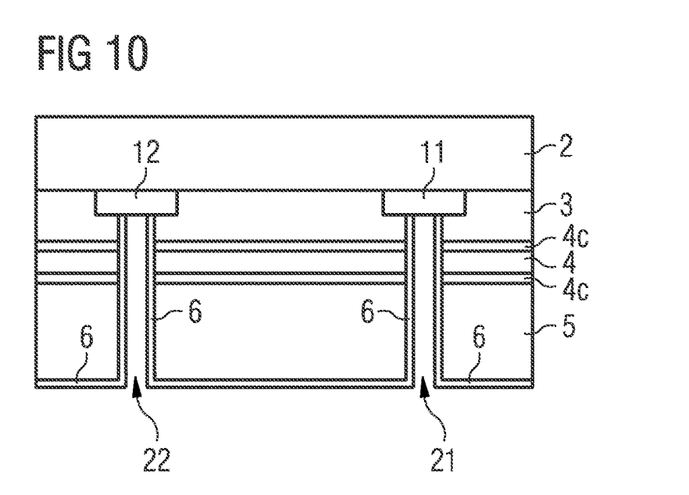

In the further intermediate step of the method shown in FIG. 10, a passivation layer 6 has been applied to the walls of the through holes 21, 22. The passivation layer 6 is preferably a silicon oxide layer, especially a $SiO_2$ layer. The passivation layer 6 covers advantageously not only the through holes 21, 22, but also the surface of the silicon substrate 5 facing away from the semiconductor layer sequence 2. The passivation layer 6 is preferably produced by a CVD process.

Figure 11:
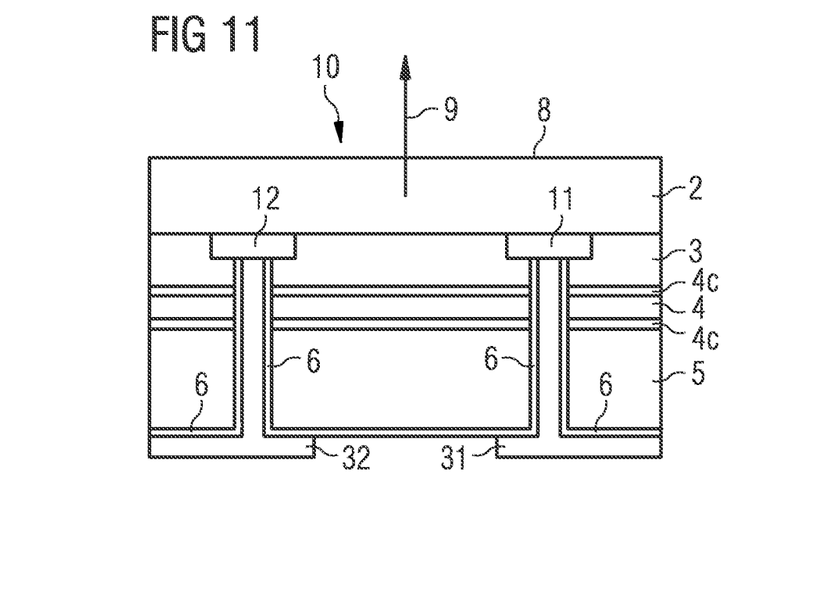

In the further intermediate step of the method shown in FIG. 11, the through holes 21, 22 have been filled with an electrically conductive material to form a first through contact 31 and a second through contact 32. The first through contact 31 is connected to the first contact layer 11 of the semiconductor layer sequence 2 and the second through contact 32 is connected to the second contact layer 12 of the semiconductor layer sequence 2. The through contacts 31, 32 may, for example, each comprise copper or consist of copper.

On the surface of the silicon substrate 5 facing away from the semiconductor layer sequence 2, the through contacts 31, 32 advantageously each have a contact surface to which the thus completed exemplary embodiment of the semiconductor device 10 may be electrically conductively connected. The semiconductor layer sequence 2 may, for example, be a light-emitting diode layer sequence which emits radiation 9 through the radiation exit surface 8. Since the electrical contacting of the semiconductor layer sequence 2 is made by means of the through contacts 31, 32 from a side opposite the radiation exit surface 8, the radiation exit surface 8 can be advantageously free of electrical contacts. This is advantageous to increase the radiation yield.

Figure 12:
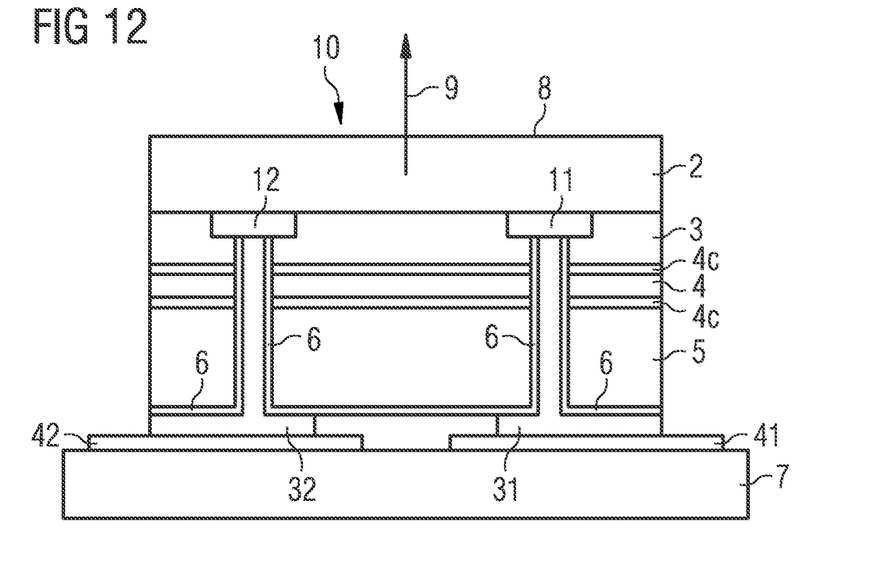
FIG. 12 shows a schematic representation of a cross-section through a semiconductor device according to an exemplary embodiment.

FIG. 12 shows an exemplary embodiment of the semiconductor device 10, in which the semiconductor device 10 is arranged on a carrier body 7. The carrier body 7, for example, comprises a first terminal layer 41, which is connected to the first through contact 31. Furthermore, the carrier body 7 comprises a second terminal layer 42, which is connected to the second through contact 32. The semiconductor device 10 is a so-called flip-chip semiconductor device in which the semiconductor layer sequence 2 is rotated by 180° with respect to the original growth direction. The radiation exit surface 8 of the semiconductor device 10 can thus be advantageously free of electrical contacts.

The carrier body 7 can be an integrated circuit that can be used to drive the semiconductor device 10. The semiconductor device 10 and the carrier body 7 are shown here and in the description of the method as examples with only two contact layers 11, 12 or terminal layers 41, 42. However, the method is also particularly suitable for producing a pixelated semiconductor device with a large number of contact layers, which is connected to a carrier body with a large number of terminal layers.

The semiconductor device 10 is characterized in particular by the fact that the metal bonding layer 4 provides good adhesion between the silicon substrate 5 and the silicon oxide layer 3 arranged on the semiconductor layer sequence 2. Furthermore, the bow of the silicon substrate 5 is advantageously low compared to direct $SiO_2$—$SiO_2$ direct bonds or silicon-silicon direct bonds due to the high temperature during direct bonding.

The invention is not restricted to the exemplary embodiments by the description on the basis of said exemplary embodiments. Rather, the invention encompasses any new feature and also any combination of features, which in particular comprises any combination of features in the patent claims and any combination of features in the exemplary embodiments, even if this feature or this combination itself is not explicitly specified in the patent claims or exemplary embodiments.

The invention claimed is:

1. A method for manufacturing a semiconductor device, the method comprising:
    forming a semiconductor layer sequence on a growth substrate;
    applying a silicon oxide layer to a surface of the semiconductor layer sequence facing away from the growth substrate;
    applying a first metal layer to the silicon oxide layer, wherein the first metal layer comprises gold, platinum, copper or silver;
    providing a silicon substrate and applying a second metal layer to the silicon substrate, the second metal layer comprising a same material as the first metal layer;
    bonding the semiconductor layer sequence to the silicon substrate by direct bonding of the first metal layer to the second metal layer, wherein the first metal layer and the second metal layer are brought into contact at a temperature in a range between 150° C. and 400° C. so that they form a metal bonding layer; and
    detaching the growth substrate from the semiconductor layer sequence, wherein each of the first metal layer and the second metal layer is not more than 20 nm thick.

2. The method according to claim 1, wherein the direct bonding comprises the direct bonding at the temperature in a range of 200° C. to 400° C.

3. The method according to claim 1, wherein the first metal layer and the second metal layer are gold layers.

4. The method according to claim 1, wherein an adhesion layer is applied before applying the first metal layer and/or the second metal layer.

5. The method according to claim 4, wherein the adhesion layer is a titanium layer.

6. The method according to claim 1, wherein the semiconductor layer sequence comprises a first contact layer and a second contact layer at the surface facing away from the growth substrate, and wherein through holes are produced extending through the silicon substrate, through the metal bonding layer and through the silicon oxide layer to the first contact layer and second contact layer.

7. The method according to claim 6, further comprising applying a passivation layer to walls of the through holes.

8. The method according to claim 1, wherein each of the first metal layer and the second metal layer is not more than 20 nm thick.

9. The method according to claim 1, further comprising smoothening the silicon oxide layer by chemical-mechanical polishing before applying the first metal layer.

10. The method according to claim 1, wherein the semiconductor layer sequence is based on a nitride compound semiconductor, and wherein the growth substrate is a sapphire substrate.

11. The method according to claim 1, wherein the semiconductor device is an optoelectronic semiconductor device.

12. A semiconductor device comprising:
    a semiconductor layer sequence disposed on a silicon substrate, the semiconductor layer sequence having a first contact layer and a second contact layer at a surface facing the silicon substrate;
    a silicon oxide layer on the surface of the semiconductor layer sequence facing the silicon substrate; and
    a metal bonding layer between the silicon substrate and the silicon oxide layer, the metal bonding layer comprising gold, platinum, copper or silver,
    wherein the metal bonding layer comprises a first metal layer and a second metal layer, the first metal layer comprising a same material as the second metal layer, and
    wherein each of the first metal layer and the second metal layer is not more than 20 nm thick.

13. The semiconductor device according to claim 12, wherein the metal bonding layer comprises a gold layer.

14. The semiconductor device according to claim 12, further comprising through holes formed in the silicon substrate extending through the silicon substrate, through the metal bonding layer and through the silicon oxide layer to the first contact layer and the second contact layer, and wherein walls of the through holes are provided with a passivation layer.

15. The semiconductor device according to claim 14, wherein the through holes are filled with an electrically conductive material connecting each of the first contact layer and the second contact layer to a terminal layer on a carrier body.

16. The semiconductor device according to claim 12, wherein the silicon oxide layer has a thickness in a range from 300 nm to 3 μm, inclusive.

* * * * *